United States Patent [19]

Schlig

[11] 4,280,197
[45] Jul. 21, 1981

[54] MULTIPLE ACCESS STORE
[75] Inventor: Eugene S. Schlig, Somers, N.Y.
[73] Assignee: IBM Corporation, Armonk, N.Y.
[21] Appl. No.: 101,390
[22] Filed: Dec. 7, 1979
[51] Int. Cl.³ .................. G11C 13/00; G11C 11/40
[52] U.S. Cl. ..................................... 365/154; 365/189; 307/238.1
[58] Field of Search ............... 365/154, 174, 189, 230; 307/238

[56] References Cited
U.S. PATENT DOCUMENTS

| 3,354,440 | 11/1967 | Farber et al. | 365/189 |
| 3,675,218 | 7/1972 | Sechler | 365/189 |
| 4,127,899 | 11/1978 | Dachtera | 365/189 |

Primary Examiner—Terrell W. Fears
Attorney, Agent, or Firm—Pollock, Vande Sande & Priddy

[57] ABSTRACT

A multiple access store having bipolar monolithic memory cells. Each cell includes a memory flip-flop comprised of cross-connected NPN transistors. A single concurrent read and write for each cell is achieved by a pair of accessing transistors, one accessing transistor of the pair connected at its base to the base of one of the flip-flop transistors and the other accessing transistor of the pair connected at its base to the base of the other of the flip-flop transistors. Each accessing transistor of an accessing transistor pair is connected at its collector to an associated bit/sense line. The emitter of each of the accessing transistors of an accessing transistor pair are connected together and the connected emitters are connected to a device that supplies a current supply to the emitters in response to a word signal. The emitters of the cross-connected flip-flop transistors are connected to an associated mode select line over which is applied a signal having a potential defining a write mode condition and a signal having a lower potential defining a read mode condition for the cell. Each pair of bit/sense lines and associated pair of accessing transistors that is added to each of the cells of a memory array may be operated to add an additional concurrent write of one word and a read of a different word for the array.

24 Claims, 10 Drawing Figures

| STATE OF CELL BEING READ | $I_1$ | $\overline{\text{CURNT 1}}$ | $I_0$ | $\overline{\text{CURNT 0}}$ | WRITE BIT | READ SENSE OUT |
|---|---|---|---|---|---|---|
| 1 | 2I | 0 | 0 | 1 | 1 | 1 |
| 0 | 0 | 1 | 2I | 0 | 0 | 0 |
| 1 | I | 0 | 0 | 1 | DON'T CARE | 1 |
| 0 | 0 | 1 | I | 0 | DON'T CARE | 0 |
| 1 | I | 0 | I | 0 | 0 | 1 |
| 0 | I | 0 | I | 0 | 1 | 0 |

MULTIPLE ACCESS STORE

DESCRIPTION

1. Technical Field

The invention relates to the accessing of bipolar monolithic memory cells in a memory array, and more particularly, to simple and energy-efficient memory cells that may be accessed for concurrent read and write operations over a single memory access cycle.

2. Background Art

Bipolar monolithic memory cells have been employed in prior art memory arrays to store bits of data for use, for example, in advanced data processing systems. A high-performance bipolar memory cell is disclosed in the U.S. patent to Farber and Schlig, No. 3,354,440, issued Nov. 21, 1967. The Farber/Schlig memory cell is relatively fast and incorporates a simple two transistor, two diode gating circuit that isolates a memory flip-flop of the cell from the effects of reading and half-selects. In addition, the cell delivers a relatively large sense signal when it is read.

However, in a monolithic memory array, the Farber/Schlig cells that are connected to common bit/sense lines may not be accessed concurrently for read and write operations during a memory cycle. It is desirable to provide a means to access a plurality of such cells during a single memory cycle so that the access time for the associated monolithic memory array may be reduced, thereby providing a more efficient operation.

The U.S. Pat. No. 3,675,218, to Sechler, issued July 4, 1972, is directed to a cell structure and accessing system wherein the cells of one data word may be read and the cells of another data word may be written during a memory access cycle. The U.S. Pat. No. 4,127,899, to Dachtera, issued Nov. 28, 1978, is directed to a similar accessing system wherein two words may be written and a third word may be read during a single memory access cycle. However, the memory cells of Sechler and Dachtera require a relatively large number of transistors and bit/sense lines to achieve the indicated multiple access functions and, therefore, the cells have an increased cost, due to the relatively large amount of space that is taken up by each cell on a chip. Also, the cells operate with a multiple collector load on the bases of the transistors of memory flip-flops, thereby reducing the switching speed of the flip-flops.

Accordingly, it is an object of the invention to provide a relatively simple bipolar monolithic memory cell of the Farber/Schlig type that may be operated to read at least one cell and to write at least another cell concurrently during a single memory access cycle, when the cells are accessed over the same bit/sense lines.

Another object of the invention is to provide an improved monolithic memory cell and cell accessing system, wherein the cells comprising two words in a memory array may be written and the cells comprising two other words of the array may be read during a single memory cycle.

A further object of the invention is to provide an improved monolithic multiple access memory cell that takes up less chip area and is lower in cost than prior art cells and that provides additional multiple access functions.

Another object of the invention is to provide a multiple access memory cell that has a reduced load on its associated flip-flop memory component, when compared with prior art multiple access memory cells, thereby providing a shorter cycle time.

It is known in the art that the average power dissipation of an array of memory cells may be reduced by reducing the power that is applied to the cells when the cells are in a quiescent state. Thus, prior art memory systems have employed a bi-level powering scheme, wherein an operational power is applied to the memory cells of an array while the array is being accessed and a lower quiescent power is supplied to the array when the array is not being accessed. However, such prior art bi-level powering schemes have typically utilized additional peripheral circuits to provide the power switching function.

Accordingly, it is an object of the invention to provide a multiple access monolithic memory cell that may be operated in an energy-efficient bi-level powering mode, without utilizing additional cicuitry.

These and other objects of the invention will become apparent from a review of the detailed specification which follows and a consideration of the accompanying drawings.

DISCLOSURE OF THE INVENTION

In order to achieve the objects of the invention and to overcome the problems of the prior art, the circuit for a multiple access cell of a memory array, according to the invention, includes a memory flip-flop for each cell comprised of cross-connected NPN transistors and pairs of bit/sense lines for each cell, each line having an associated NPN accessing transistor with the base connected to the base of an associated one of the cross-connected flip-flop transistors. The accessing transistors of each accessing transistor pair are connected at their emitters to a current supply that is provided in response to an associated word signal.

The emitters of the cross-connected flip-flop transistors are connected to a mode select line. A write mode signal is applied on the mode select line to allow the conducting state of the flip-flop transistors to be determined by an applied write pulse on one line of a pair of bit/sense lines. A read mode signal having a lower potential than a write mode signal is applied on the mode select line to lower the potential at the bases of the connected flip-flop transistors and associated accessing transistors and to thereby prevent the saturation of the accessing transistors and the changing of the state of the flip-flop transistors.

Additional pairs of bit/sense lines and associated accessing transistors may be applied to each cell of the memory array. For each pair of operational bit/sense lines that is added, a word line is added to define in conjunction with a word signal a current supply for the connected emitters of the added accessing transistors. Each pair of added bit/sense lines, associated accessing transistors and word lines provides for an additional concurrent write of one word and read of another word during a memory access cycle of the memory array.

Diodes may be added to the collector connection between each bit/sense line and associated accessing transistor to ensure that, when a write pulse is applied on the bit/sense line, current does not flow in the collector circuit of the saturated accessing transistor. The diodes also make the array insensitive to write half-selects.

BEST MODE FOR CARRYING OUT THE INVENTION

The remaining portion of this specification will describe preferred embodiments of the invention when read in conjunction with the attached drawings, in which like reference characters identify identical apparatus.

Figure 1:
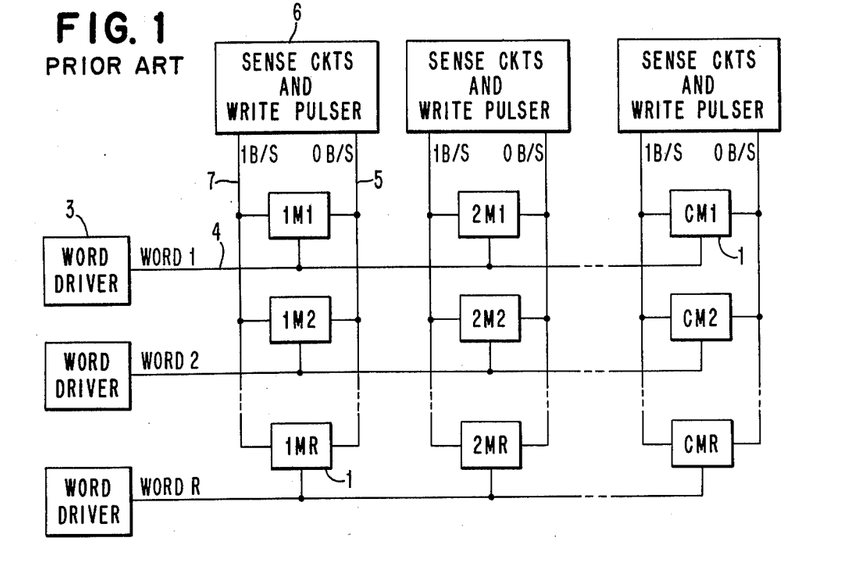
FIG. 1 illustrates a block diagram of a prior art memory array having a plurality of memory cells and associated word lines and bit/sense lines.

FIG. 1 illustrates a block diagram of an array of memory cells 1 and associated access lines that are employed in typical prior art memory access systems. Each memory cell 1 is employed to store a bit of binary data and the cells are arranged so that each row of cells defines a digital data word. Thus, the first word of the array includes the cells 1M1, 2M1, . . . , CM1 and successive data words are stored at successive rows of the array.

In operation, a particular cell is accessed for either a read or a write operation by applying an access signal to an associated word line of the cell. Thus, if it is desired to read or write any cell or all of the cells of the first data word, an accessing signal is applied by a word driver 3 to a word line WORD1. The contents of each cell along the word line WORD1 is then defined by a cell current that flows in either a 1B/S or 0B/S bit/sense line that is connected to the cell. Thus, if the cell 1M1 contains a binary zero, for example, a current will flow in the 0B/S line 5 and the current may be automatically sensed by a sense circuit portion of a sense circuit and write pulser 6. Of course, if a current flows in a 1B/S line 7, the cell 1M1 then contains a binary 1.

A bit of data may be written into the cell 1M1 by concurrently energizing the WORD1 line and a write pulser of the circuit 6. The write pulser applies a negative pulse to either the line 5 or the line 7, depending upon whether it is desired to write a 0 or a 1 into the memory cell. For example, if the WORD1 line is energized and negative pulse is applied to the OB/S line 5, a binary 1 will be stored in the cell 1M1. Conversely, a negative pulse on the 1B/S line 7 will cause a binary 0 to be stored in the cell.

Figure 2:
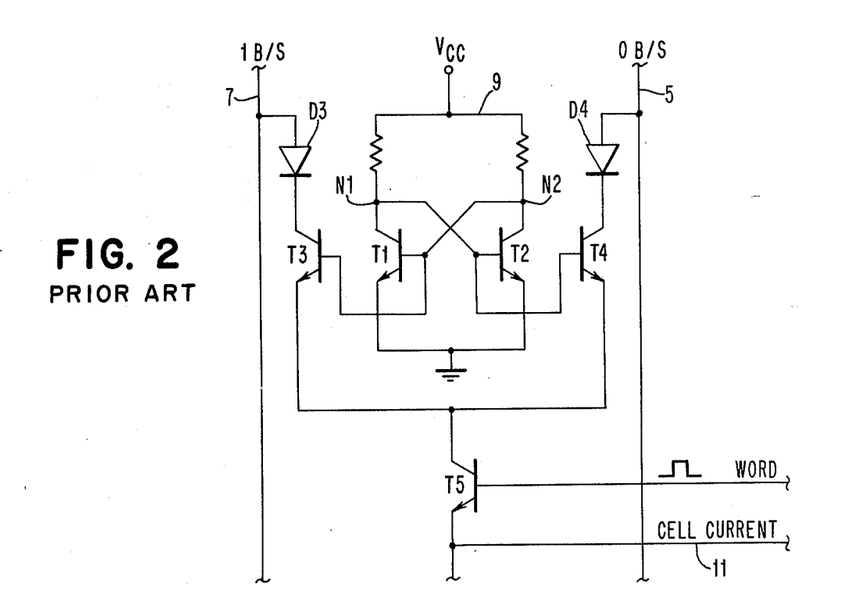
FIG. 2 illustrates a circuit diagram of a prior art Farber/Schlig bipolar monolithic memory cell.

FIG. 2 illustrates a circuit diagram of a prior art bipolar monolithic memory cell that is disclosed in the paper by F. S. Farber and E. S. Schlig, "A Novel High Performance Bipolar Monolithic Memory Cell," *IEEE Journal of Solid State Circuits*, Vol. SC-7, No. 4 (August 1972). The disclosure of the Farber/Schlig paper and the corresponding U.S. Pat. No. 3,354,440 to Farber and Schlig, are incorporated herein by reference to illustrate the prior art relating to the multiple access cell of the invention. As shown in FIG. 2, the Farber/Schlig memory cell includes a memory flip-flop 9 that is comprised of two cross-connected NPN, emitter coupled transistors T1 and T2. In operation, the flip-flop 9 is employed to store a particular binary bit of data, the logic 1 or logic 0 state of the flip-flop being indicated by the conducting or non-conducting states of the cross-connected NPN transistors T1 and T2. For the purpose of understanding the invention, it will hereafter be assumed that the memory flip-flop 9 registers a binary "1" when a node N2 has a high voltage level relative to the voltage level at an opposing node N1. Likewise, a binary "0" is stored in the memory flip-flop 9 when the node N1 has a voltage level that is relatively higher than the voltage level at the node N2.

It will be appreciated by those skilled in the art that when a binary 1 is stored in the flip-flop 9, the transistor T1 will be conducting and the cross-connected transistor T2 will not be conducting. Likewise, when a binary 0 is stored in the memory flip-flop 9, the transistor T2 will be conducting and the transistor T1 will not be conducting.

It should be understood that the circuit of FIG. 2 represents a single cell of a memory array. Accordingly, the cell has a WORD accessing line and associated 1B/S and 0B/S bit/sense lines 7 and 5. The bit/sense lines of the cell shown in FIG. 2 are connected to the next successive cell in a column of a memory array while the word line is connected to the next successive cell in a row in the same manner as is shown for the array of FIG. 1.

If it is desired to read the cell of FIG. 2, a positive electrical pulse is applied to the word line to energize the base of a supply transistor T5 and to thereby cause the transistor T5 to conduct. The emitter of the transistor T5 is connected to a cell current line 11 that is also connected to the emitters of the supply transistors of cells in the same column of the array. The conducting transistor T5 supplies current from the current line 11 to the connected emitters of two accessing transistors T3 and T4. If it is assumed that a binary 1 is stored in the flip-flop 9 of FIG. 2, the accessing transistor T3 will be turned on due to the high voltage at the node N2 and the sense current of the supply transistor T5 will flow through the conducting transistor T3, a diffused diode D3 and the line 1B/S, thereby indicating that the state of the memory flip-flop 9 is a binary 1. The sense current will continue to flow in the line 1B/S for as long as the positive pulse is applied to the word line to energize the transistor T5. It should be understood that, if a logic zero is stored in the memory flip-flop 9, and if a positive pulse is applied to the word line, the accessing transistor T4 will conduct and thereby pass sense current through a diffused diode D4 to the 0B/S line 5.

If the contents of the memory flip-flop 9 of FIG. 2 is a binary 0, the flip-flop may be written to a binary 1 by applying a positive pulse to the word line and simultaneously, or shortly thereafter, applying a negative write pulse to the 0B/S bit/sense line 5. The negative pulse on the bit/sense line 5 back biases the diode D4 and lowers the voltage on the collector of the transistor T4 below the potential level of the base of the transistor T4, thereby saturating the transistor T4 in response to the sense current of the transistor T5. Thus, a base/emitter saturation current flows to cause the base of the transistor T2 and the associated node N1 to be pulled relatively lower than the base of the transistor T1 and associated node N2. The higher voltage at N2 and the base of the transistor T1 will result in T1 being turned on to a conducting state and T2 being turned off. It should be understood that if the contents of the flip-flop is a binary 1, the state of the flip-flop will not be changed when the word line is selected and a negative pulse is applied on the 0B/S line.

If the contents of the flip-flop is a binary 1, a positive signal on the word line and a negative pulse on the 1B/S line will back bias the diode D3 and saturate the transistor T3, thereby causing the transistor T2 to conduct and the transistor T1 to stop conducting so that a binary 0 is stored in the flip-flop. Of course, if the contents of the flip-flop is a binary 0, the state of the flip-flop will not be changed when the word line is selected and a negative pulse is applied to the 1B/S line.

The words of the memory array of FIG. 1 are accessed over a memory cycle that defines the time over which a memory accessing operation takes place. It should be understood that if the cells of the array of FIG. 1 are constructed in the manner described for FIG. 2, it will not be possible to write a first word of the memory array and read a second word of the array during a single memory cycle, since if more than one word line is energized during a memory cycle, a write pulse on a bit/sense line will write all of the cells having activated word lines. Moreover, even if the first word is somehow written while the word line of the second word is activated, it is still not possible, with the structure of FIG. 2, to read the contents of the cells of the second word during the same memory cycle, since the shared bit/sense lines of the words will carry currents corresponding to both the newly written contents of the first word and the contents of the second word.

Figure 3A:
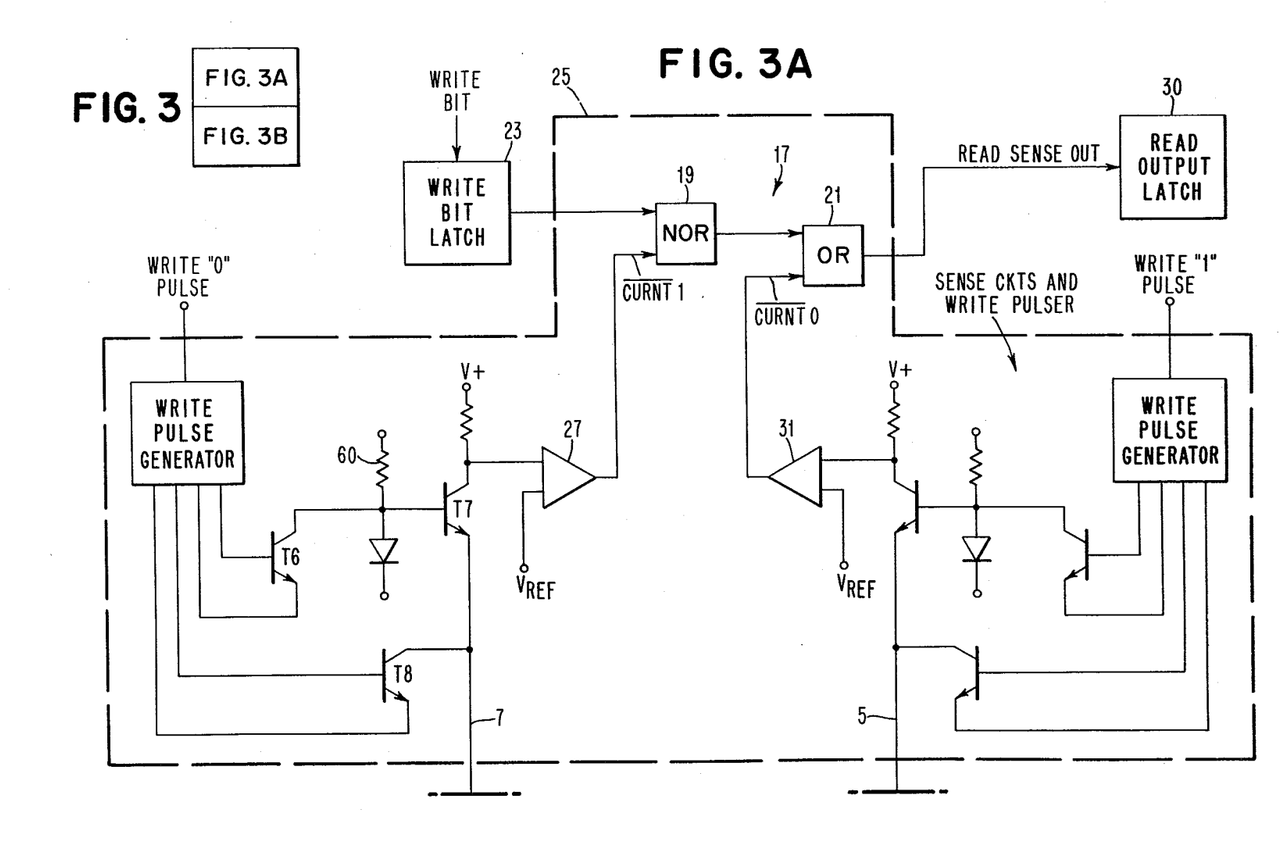
FIGS. 3A and 3B illustrate a circuit diagram of a memory in accordance with the invention.
Figure 3B:
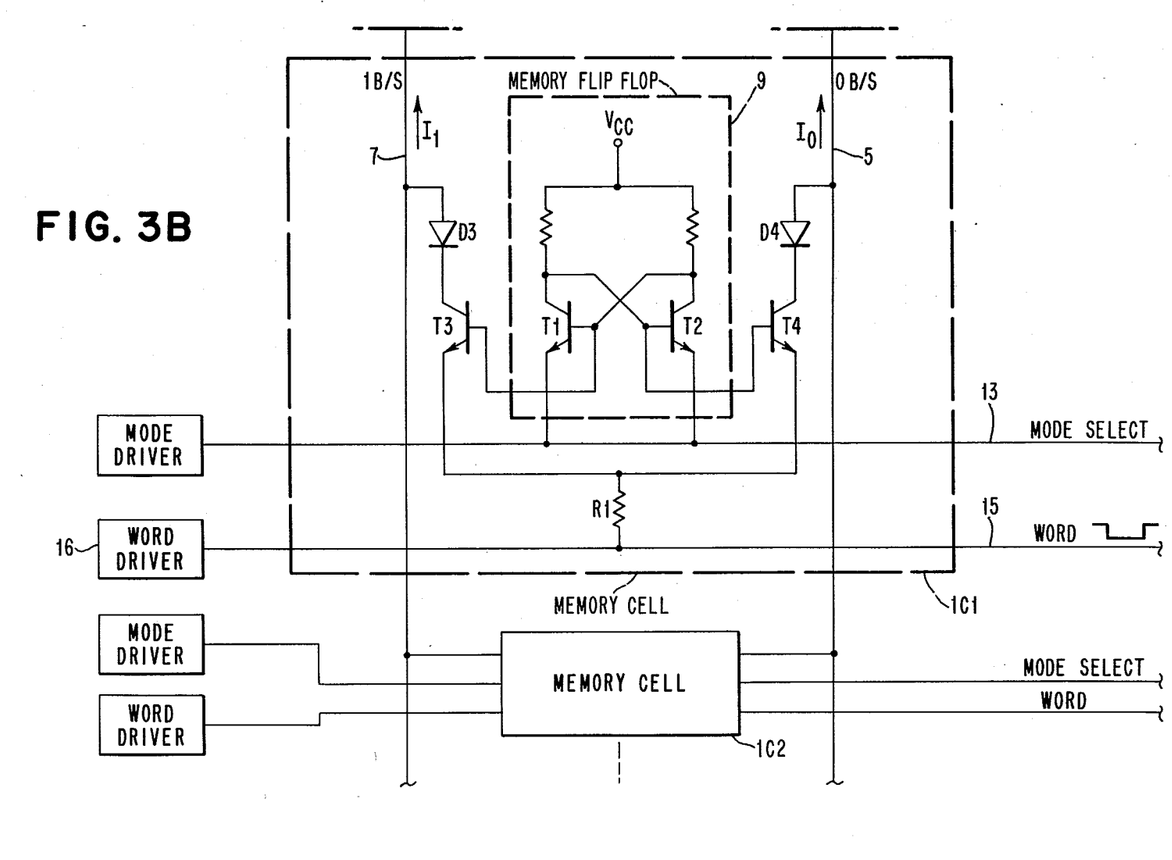

FIG. 3 illustrates a circuit diagram of a multiple access memory cell 1C1, in accordance with the invention, and associated access circuitry that may be utilized to write the cell 1C1 and to read a different cell, for example 1C2 during a single memory cycle, when the accessed cells share a common pair of bit/sense lines. The memory cell 1C1 of FIG. 3 operates to store a binary 1 or 0 or to read a binary 1 or 0 in much the same manner as was described for the prior art Farber/Schlig cell of FIG. 2. However, the memory cell of the invention utilizes a mode select line 13 for each row of cells to determine whether the cells in the row are to be read or written. By this means, one row of cells or word of an array may be written and the cells of another word may be read during a single memory cycle.

In operation, if it is desired to write the cells of a particular word, for example a word including the cell 1C1 of FIG. 3, the mode select line 13 is raised to a particular high write potential level. At the same time or shortly thereafter, a negative word pulse is applied at an associated word line 15 to supply sense current to the connected emitters of the accessing transistors T3 and T4 through a resistor R1 and a negative pulse is applied to either of the bit/sense lines of the cell to saturate one of the transistors T3 or T4 and to back bias one of two respective diffused diodes D3 or D4, thereby determining the state of the memory flip-flop of the cell.

It should be understood that if the diffused diodes D3 and D4 are replaced in the circuit of FIG. 3 by load resistors, the circuit should still operate in the indicated fashion. However, the diodes are included to ensure that current will not flow from the collectors of either of the accessing transistors T3 and T4 when the transistors are operated in the saturation mode and to make the circuit insensitive to write half-select pulses. Moreover, it should be understood that the diffused diodes D3 and D4 may be replaced by ion-implanted diodes or by schottky diodes, without departing from the spirit of the invention. As described in the aforementioned paper by Farber and Schlig in connection with the prior art memory cell of FIG. 2, the diodes D3 and D4 may be integrated into the collector regions of T3 and T4. The part of the collector regions normally occupied by the collector contacts serve as the cathodes of the diodes, while the anodes of the diodes are formed by the same diffusion that forms the bases of the transistors.

As a practical matter, a transistor T5 current supply circuit, such as was employed for the cell of FIG. 2, may not be used to supply sense current to the cell of FIG. 3, since for the embodiment of FIG. 3 more than one cell in a column of the array can require sense current at the same time, while the transistor T5 supply circuit of FIG. 2 is intended to supply sense current to only one cell of a column at a time. Accordingly, a word driver 16 supplies sense current to all of the cells of a word over the word line 15 and each cell receives the sense current by means of a resistor, for example R1.

Figure 4:
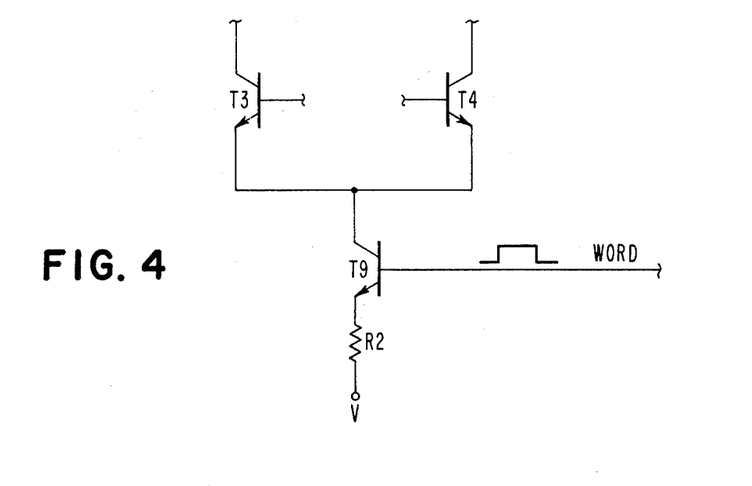
FIG. 4 illustrates a circuit diagram of an alternative apparatus for applying a source current to a bipolar monolithic memory cell in accordance with the invention.

The circuit of FIG. 4 shows an alternative means for supplying sense current to the cell 1C1 of FIG. 3. As shown in FIG. 4, the emitter of a transistor T9 is connected to a voltage source V through a resistor R2 and the collector of the transistor is connected to the connected emitters of associated accessing transistors, for example T3 and T4. In operation, a sense current is applied to the transistors T3 and T4 by applying a positive pulse to the word line and thereby causing the transistor T9 to conduct. It should be understood that the transistor T9 and associated resistor R2 may be used in place of the resistor R1 of FIG. 3, if the signal on the word line is changed from a negative voltage supply pulse to a positive voltage base gating pulse.

The cell 1C1 may be read by applying a read mode signal of reduced potential to the mode select line 13. The read mode signal may be reduced, for example, by less than a volt with respect to the higher potential of the write mode signal, although the potential of the read signal must be sufficiently low to ensure that the potential at the bases of the transistors T1, T2, T3 and T4 is reduced to a point where the transistors will not be saturated in response to a negative write pulse on a bit/sense line. Thus, the lower potential signal on the mode select line 13 ensures that the memory flip-flop 9 of a cell will remain unaffected if a write pulse is applied on a bit/sense line of the cell. Accordingly, if two cells share the same bit/sense lines, a relatively high write potential is applied to the mode select line of one cell and a lower read potential is applied to the mode select line of the other cell, so that the cell having the higher potential on its mode select line will respond to a write pulse and the cell having the lower potential on its mode select line will not respond to the write pulse.

It should be understood that the lower signal that is applied on the mode select line 13 of a cell during the read mode increases the current through the flip-flop of the cell, thereby ensuring that the flip-flop will not be written by spurious signals that may appear on the accessing lines during a read operation. Thus, when a cell is being read, the lower mode select signal causes the cell to be relatively immune to noise.

When the cells of a memory array are not being accessed, a relatively high potential, corresponding to the write mode signal, may be applied to the mode select lines to reduce the power dissipation of the cells. Thus, power will be conserved while the array is in a quiescent state. When the array of cells is initially accessed, all cells that are not being written will receive relatively low-potential read mode signals on their mode select lines 13, thereby temporarily increasing the power dissipation of the unaccessed cells but also, as explained above, increasing the immunity of the cells to noise. Accordingly, it should be appreciated that the mode select line not only provides a means whereby many cells having common bit/sense lines may be accessed in a single memory cycle, but also provides a bi-level powering scheme that may be employed to reduce the average power dissipation of the cells of an array.

It will be appreciated by those skilled in the art that the bi-level powering feature of the mode select line is advantageous in that it achieves the bi-level powering effect without requiring additional power control circuits. It should also be understood that when the cells of the array are in the quiescent state, the signal on the mode select line is sufficiently low to provide a current in the memory flip-flop of the cell that will hold the memory state of the cell in the absence of disturbing signals.

As indicated above, a write mode signal may be applied to a first cell and a read mode signal may be applied to a second cell that shares the same bit/sense lines. Thereafter, the word signals of the two cells may be applied and a write pulse may then be applied to one of the shared bit/sense lines to write only the first cell. After the word signal, write mode signal and write pulse are applied, the memory flip-flop transistors and associated accessing transistors of the first cell will be in transition for a short period of time. At the end of the transitory period, the newly written data bit will be registered by the state of the first cell.

The second cell is read immediately after the transitory period of the first cell, but still within the memory access cycle. At the time that the second cell is read, the sense current that is flowing in the bit/sense lines reflects both the state of the newly written cell and the state of the cell that is to be read. Accordingly, the total current that flows on the shared bit/sense lines must be logically analyzed to derive the state of the second cell.

The logical analysis is achieved by a simple logic circuit 17 comprised of a NOR gate 19 and an OR gate 21. The logic circuit 17 receives as inputs a first signal CURNT1 that is a logic 1 if current is not flowing in the 1B/S line 7 and a second signal CURNT0 that is a logic 1 if current is not flowing in the 0B/S line 5. A third signel is provided by a write bit latch 23 that indicates whether a 1 or a 0 was written to the first accessed cell during the initial portion of the memory cycle.

Figure 5:
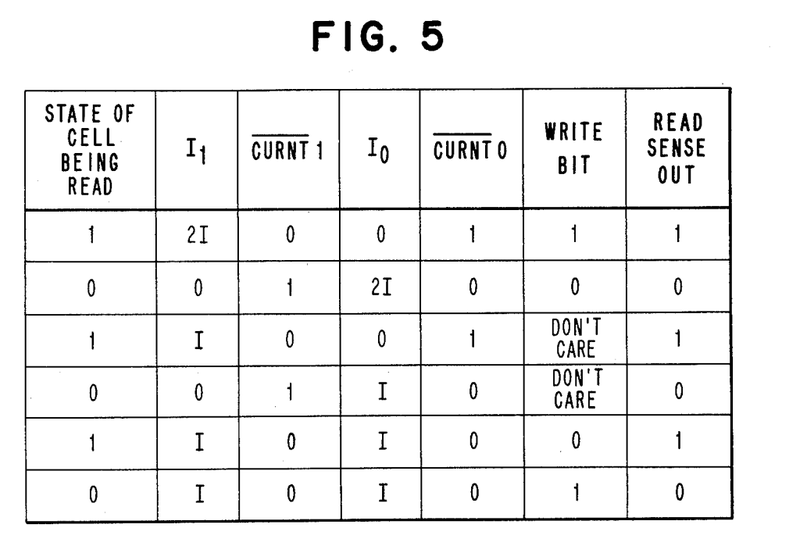
FIG. 5 illustrates a truth table of the logic states of the read sense logic of the circuit of FIG. 3.

FIG. 5 illustrates a truth table of the possible logic states of the logic circuit 17. As indicated at the first line of the table, if the state of the cell being read is a logic 1 and if the cell that was written now contains a logic 1, a sense current $I_1$ of the magnitude I will flow from both of the cells and the total current $I_1 = 2I$ will flow on the line 7 to a sense circuit and write pulser 25. Of course, no current will flow on the line 5, since the written cell and the cell that is to be read both contain a logic 1.

In the sense circuit and write pulser 25 a signal derived from the combined sense current 2I is compared to a reference signal $V_{REF}$ by a comparator 27. The $V_{REF}$ signal defines a "no-current" condition. Accordingly, if the current of the bit/sense line exceeds the no-current condition, the comparator 27 will generate a logic 0, thereby indicating a "current present" condition. However, if the current of a line 7 is equal to or less than the threshold current defined by $V_{REF}$, the comparator 27 will generate a logic 1, thereby indicating a "current not present" condition.

It should be appreciated that the comparison of the current of the bit/sense line to a particular "zero threshold" signal provides a means to reliably sense the presence or absence of current and, therefore, ensures that the apparatus of the invention will operate properly despite significant differences in the magnitude of the logic 1 current that flows from particular cells. Thus, tolerances for the resistors or other components which determine cell current may be relaxed, thereby reducing the cost and increasing the effectiveness of the apparatus of the invention.

It should be understood that the comparator 27 of FIG. 3 is a device that is well-known in the art and, therefore, the particular structure of the comparator need not be discussed in detail.

Since both the written cell and the cell to be read have stored a logic 1, no sense current will flow in the bit/sense line 5. Therefore, a signal representing either no current or a very small current will be compared by a second comparator 31 to $V_{REF}$ and the comparator will the generate a logic 1 to reflect the no current condition of line 5. Accordingly, as shown in the first line of the table of FIG. 5, a logic 1 CURNT0 signal applied to the input of the OR gate 21 will force the read sense output of the gate 21 to a logic 1, thereby registering the logic 1 that is stored in the cell that is being read. The output of the OR gate 21 is stored in a read output latch 30 and the contents of the latch 30 may then be accessed by a computer or other data handling device.

In a similar fashion, the second entry of the truth table of FIG. 5 indicates that if a zero is stored in the cell that is being read and a zero is written into the other cell, a double current $I_0 = 2I$ will flow in the line 5 and no current will flow in the line 7. Therefore, the output of the comparator 31 will be a logic 0 and the output of the comparator 27 will be a logic 1. Thus, both inputs of the OR gate 21 will be low and the read sense output will be a logic 0, thereby reflecting the logic 0 that is stored at the cell being read.

The third and fourth entires in the table of FIG. 5 illustrate the logical possibilities that may occur if a cell is read, but no other cell is written during a memory cycle. In this event, a current will flow in either the line 7 or the line 5, in accordance with the state of the cell that is read. If a logic 1 is stored in the cell, a current $I_1 = I$ will flow in the line 7 and no current will flow in the line 5. Therefore, the comparator 27 will generate a logic 0 and the comparator 31 will generate a logic 1. The logic 1 output of the comparator 31 will force the output of the OR gate 21 to a logic 1 state, thereby registering the logic 1 state of the cell that is read. Likewise, if a logic 0 is stored in the cell, a current $I_0$ will flow in the line 5 and no current will flow in the line 7.

Therefore, the output of the comparator 27 will be logic 1 and the output of the comparator 31 will be a logic 0. Two low inputs to the OR gate 21 will force a logic 0 at the read sense output, thereby registering the logic 0 that is stored at the cell that is read. Of course, when a write is not performed, the state of the write bit latch is a "don't care" logic condition with respect to the operation of the logic circuit 17.

The fifth line of the table of FIG. 5 illustrates a situation wherein a logic 0 has been written to a cell and a logic 1 is stored at the cell that is being read. Thus, a current $I_1 = I$ flows in the line 7 and a corresponding current $I_0 = I$ flows in the line 5. Accordingly, the output of the comparators 27 and 31 are logic 0's and, thus, the state of the output of the OR gate 21 is dependent upon the state of the write bit latch 23. Since a binary 0 was written, a logic 1 appears at the output of the OR gate 21, thereby registering the logic 1 that is stored at the cell that is being read. Likewise, if the cell that is being read contains a logic 0 and binary 1 is written to another cell, the logic 1 of the write bit latch 23 together with the logical 0 output of comparator 31 will force a logic 0 at the output of the OR gate 21.

It should be understood that if current is flowing in both the line 5 and the line 7, it is known that the contents of the cell that is being read is opposite the contents of the cell that was written. Therefore, the contents of the cell that is read must necessarily be the inverse or complement of the logic state that was written.

It will be appreciated by those skilled in the art that, although the logic current 17 of FIG. 3 reflects the logic conditions defined in the table of FIG. 5, other logic circuit may be employed to achieve similar results, without departing from the spirit of the invention.

The sense circuits and write pulser 25 operates both to sense the condition of current in the lines 7 and 5 and to pulse the respective lines 7 and 5 with write pulses. The first stage of the sense circuits, including current sensing transistors T7, should exhibit a low input impedance to sense currents $I_1$ and $I_0$ in order to minimize the voltage change on bit/sense lines 7 and 5 in response to changes in $I_1$ and $I_0$. To that end, T7 is shown in FIG. 3 as a common base amplifier with the base bias potential established by a low impedance bias circuit 60, including a register and a diode. Other low-input impedance sense circuits are known in the art and may be utilized in place of the circuit of FIG. 3. Since a write pulse may be present on a bit/sense line at the same time that the current flowing on the line is sensed by a comparator, circuitry is provided to ensure that a pulse on the line will not affect the state of the signal that is applied to an associated comparator. This is accomplished by applying a pulse to the base of transistor T7 at the same time as, and of the same amplitude as, the write pulse which is applied to bit/sense line 7. These pulses are derived from a write pulse generator, the output stages of which are represented by transistors T6 and T8.

In operation, a write pulse is applied in accordance with a control program, for example the program of a computer, and the pulse is applied to the base-emitter circuits of transistor T6 and transistor T8. The transistor T8 applies the negative write pulse to the bit/sense line 7 and the base of the current sensing transistor T7 is adjusted by a corresponding pulse applied by transistor T6 to maintain a constant current output from T7. It should be understood that corresponding circuitry provides the same function for any write pulse that is applied to the bit/sense line 5.

Figure 6:
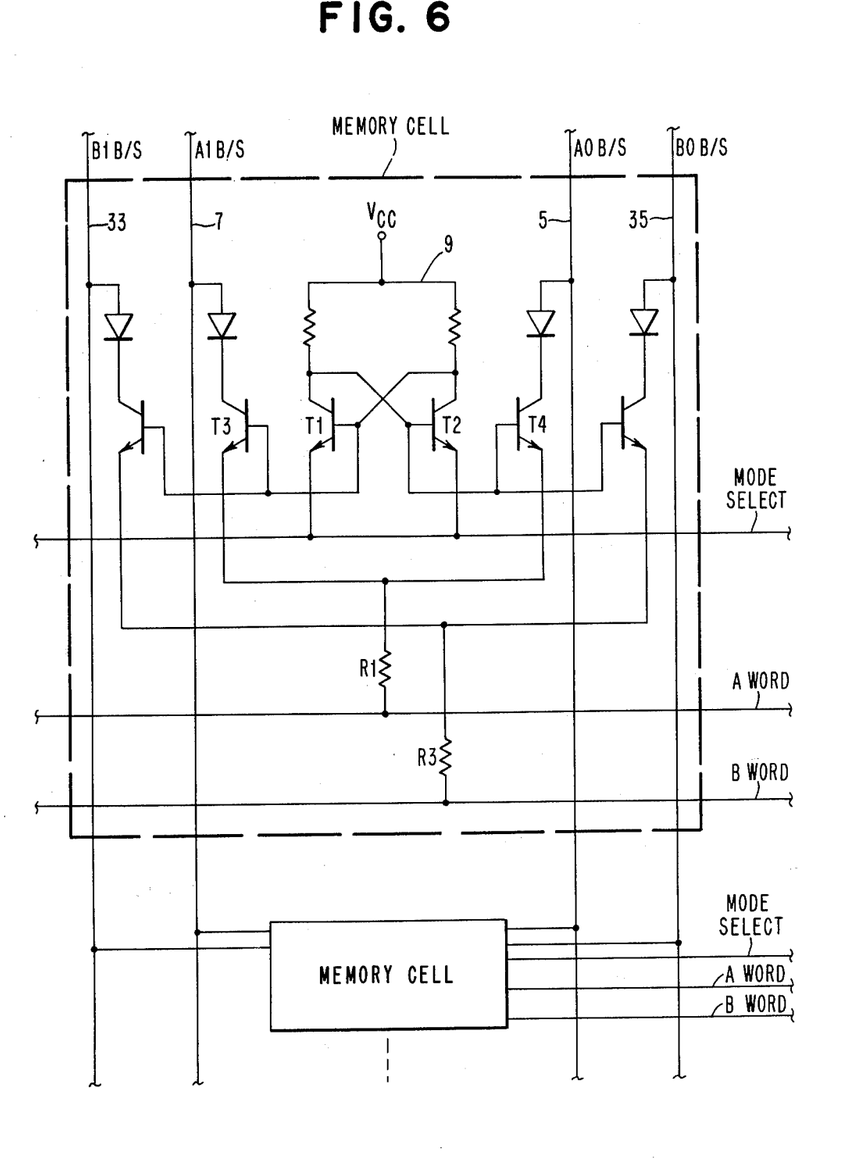
FIG. 6 illustrates a circuit diagram of an embodiment of the invention wherein two writes of the cells of different digital words and two reads of the cells of different digital words may be concurrently executed during a single memory access cycle.

FIG. 6 illustrates a preferred embodiment of a memory cell, in accordance with the invention, that may be employed to write two different words of a memory array and to read two additional different words of the array during a single memory cycle. Although FIG. 6 illustrates only a single memory cell, it should be appreciated that the cell structure of FIG. 6 is repeated in a memory array to define the cells of the array. Also, as indicated above, the current supply resistors R1 and R3 of FIG. 6 may each be replaced by the transistor supply circuit of FIG. 4.

The memory cell of FIG. 6 operates in the same fashion as the cell of FIG. 3. However, the cell of FIG. 6 has two pairs of bit/sense lines, an inner pair of lines 5 and 7 that correspond to the bit/sense lines shown in FIG. 3 and an outer pair of lines 33 and 35. Either pair of lines may be utilized in the manner described for FIG. 3 to read or write the memory flip-flop 9 of the cell of FIG. 6. Of course, only one pair of lines may be employed to access a single cell of an array, for example the cell of FIG. 6, during a memory access cycle.

Thus, in operation, a word, comprising a row of cells, is accessed for a read or write operation by applying an access signal to the A or B word line and applying a signal to the mode select line to prepare the cells of the word for either a read or a write operation. As shown in FIG. 6, the bit/sense lines 5 and 7 are employed to access the memory flip-flop 9 if the A word line is selected and the bit/sense lines 33 and 35 are employed to access the memory flip-flop if the B word line is selected.

Accordingly, the A word line may be selected to write a first row of cells and to read a second row of cells during the same cycle, in the manner described for the cell of FIG. 3. At the same time, the B word line may be selected to write a third row of cells and to read the contents of a fourth row of cells. Thus, four rows of cells or words may be accessed simultaneously if each of the cells of a memory array are constructed in accordance with the preferred embodiment of FIG. 6.

It should be understood that for any particular cell, either the A word line or the B word line is operative during a particular memory access cycle to access the cell. At no time are the A and B word lines of a cell simultaneously activated. In addition, during a memory access cycle, the A word lines of two separate words may be activated to provide a concurrent write for one word and a read for the other word and may not be activated to write both of the words or read both of the words. Likewise, the B word lines of two words may be activated during a single memory access cycle to read one word and to write the other word, but not to read both words or to write both words.

It will be appreciated by those skilled in the art that the activation of appropriate word lines and mode select lines will be typically performed under the direction of a control device, for example a computer, in a manner known to the art.

FIG. 7 illustrates a block diagram of a memory array that utilizes memory cells having the structure and function of the cell illustrated in FIG. 6. As shown in FIG. 7, each row of cells 37 may be accessed during a memory access cycle by either a first pair of A bit/sense lines 5 and 7 or a second pair of B bit/sense lines 33 and 35. If the A word line of a cell is energized, the cell may be read or written, in accordance with the condition of the mode select line, by an A sense circuit and write pulser 39. Likewise, if the B word line of a cell is energized, the cell may be read or written in accordance with the condition of the mode select line, by a B sense circuit and write pulser 41. Of course, the sense circuits and write pulsers 39 and 41 of the embodiment of FIG. 7 operate in the manner described for the embodiment of FIG. 3.

Figure 7:
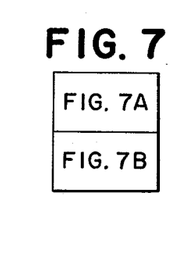
FIGS. 7A and 7B illustrates a block diagram of a multiple access memory array having cells and associated accessing circuitry in accordance with the embodiment of FIG. 6.
Figure 7A:
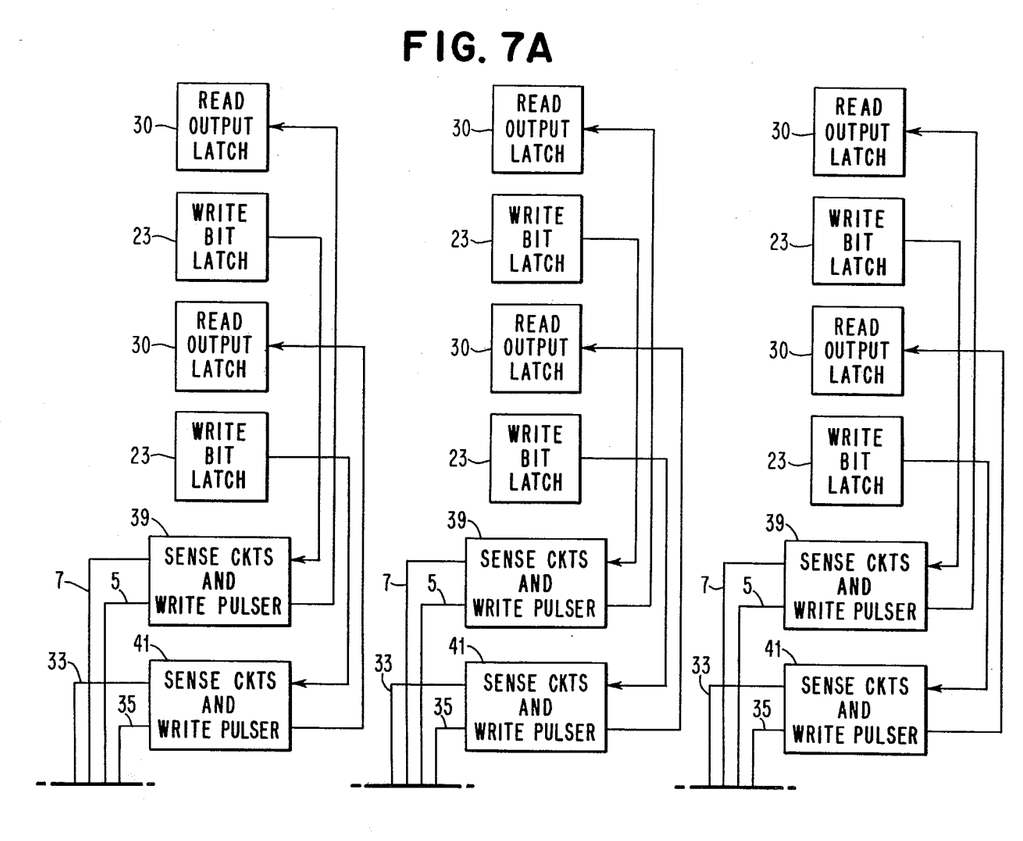
Figure 7B:
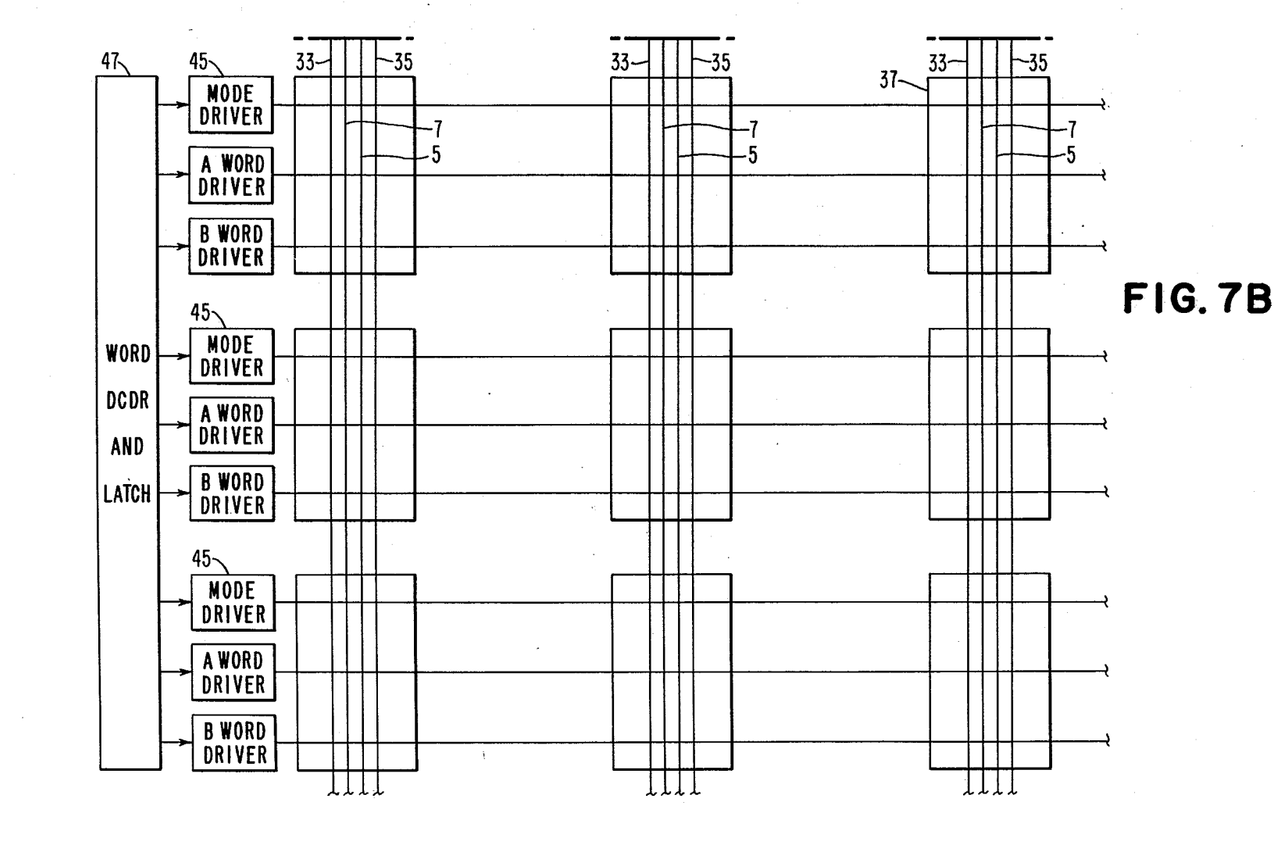

A plurality of write bit latches 23 are provided to store the bits of a word that is to be written and a control device, for example a computer (not shown) applies corresponding write pulses that are distributed to the bit/sense lines of each cell to write identical bits in the cells of a memory array. Read output latches 30 are provided to store the bits that are read from the cells.

"A" word drivers and "B" word drivers are utilized to apply word signals to activate associated rows of memory cells. Likewise, a mode select driver 45 is utilized to apply a mode select signal to the cells of a particular word or row. Such drivers are well-known to the art and, therefore, those skilled in the art will understand how the drivers are applied to achieve the functions of the invention.

The drivers of FIG. 7 may be operated in accordance with control bits that are stored in latches of a word decoder 47 that receives the control bits from a control source, for example a computer (not shown). As a practical matter, the cells and associated accessing apparatus of FIG. 7 may be arranged on a single chip in a manner known to the art to provide a multiple access memory storage array.

Although the memory array of FIGS. 6 and 7 has been described with respect to memory cells that utilize two pairs of bit/sense lines and two pairs of associated accessing transistors to write two words and to read two words during a memory cycle, it should be appreciated that each cell may be easily modified to include additional pairs of bit/sense lines, accessing transistors and diffused diodes to increase the number of words that may be concurrently read and written.

More particularly, it should be understood that additional pairs of NPN accessing transistors may be connected at their respective bases to associated bases of the flip-flop resistors T1 and T2. A pair of diffused diodes and an associated pair of bit/sense lines may then be added for each of the added pairs of accessing transistors in the manner shown in FIGS. 3 and 6. It should be understood that any number of pairs of bit/sense lines and associated pairs of accessing transistors and diffused diodes may be added to the cells of an array to achieve greater numbers of concurrent reads and writes for the words of the array, provided that the loading on the flip-flop transistors T1 and T2 of each cell is not excessive.

Figure 8:
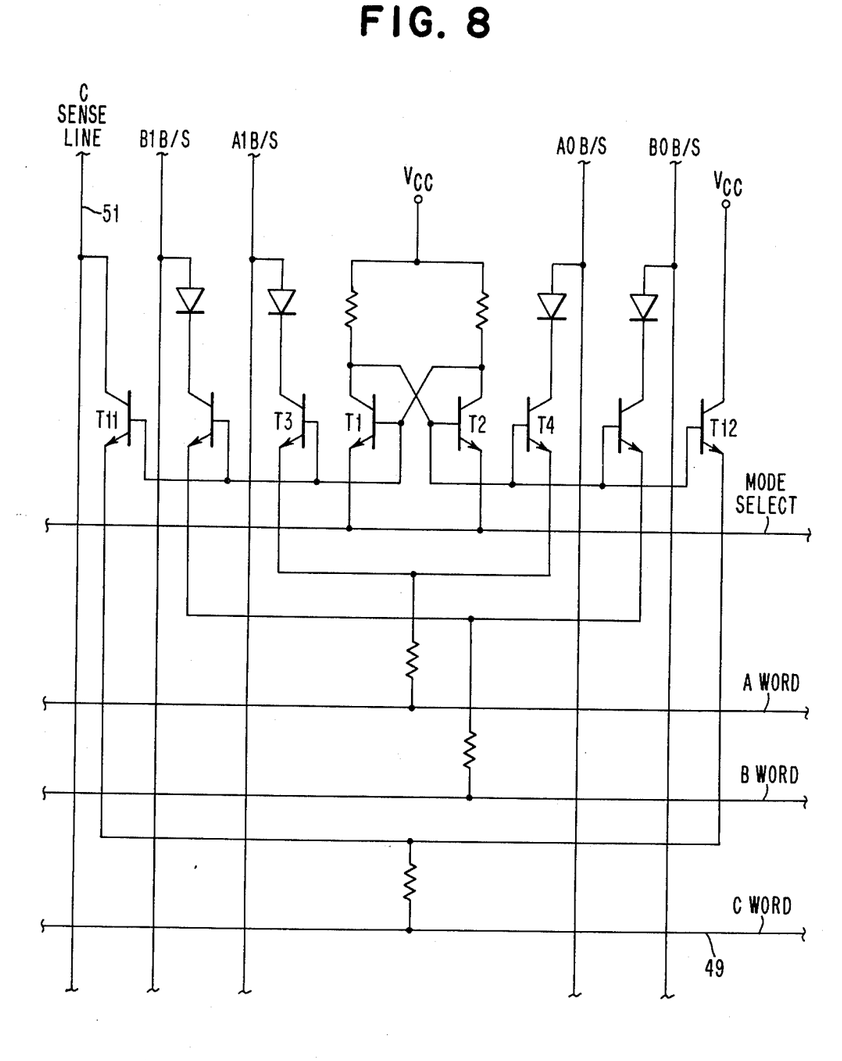
FIG. 8 illustrates another embodiment of the invention wherein writes of two different digital words and reads of three different digital words may be concurrently executed during a single memory access cycle.

FIG. 8 illustrates an alternative embodiment of the invention wherein cells of a memory array may be constructed to provide two concurrent writes and three concurrent reads of separate words of a memory array. The apparatus of FIG. 8 is the same as the apparatus of FIG. 6, except for the addition of two accessing transistors T11 and T12, an associated C sense line and a C word line 49. Each transistor is connected at its base to the base of one of the flip-flop transistors T1 and T2. The transistors T11 and T12 may be utilized to read a cell by energizing the C word line and then noting the presence or absence of current in the C sense line 51. If the memory flip-flop 9 of FIG. 8 operates to store a 1 or 0 in the manner described for the flip-flop of FIG. 3, a logic 1 will be registered by a conventional sense circuit and latch on the line 51 if current is present on the line and a logic 0 will be registered by the sense circuit and latch if no current is registered on the line 51. It should be appreciated that, since the added C word accessing transistors T11 and T12 are not intended to write a cell, diffused diodes and a write pulser circuit for line 51 are not required and the sense circuits may be of a type known in the art. Of course, it should be understood that more than one pair of read-only lines and associated transistors may be added to the cells of a memory array to allow additional concurrent reads, without departing from the spirit of the invention.

Although the circuits of the invention have been described with respect to NPN transistors, it should be understood that PNP transistors may be utilized to achieve the same functions in a manner known to the art, without departing from the spirit of the invention.

It will be understood by those skilled in the art that in writing the cell, the transistors T1, T2, T3 and T4 are saturated and, after the write operation is complete, the transistors require a certain time to recover. The recovery period may be reduced by providing special doping for the transistors or by connecting schottky barrier diodes across the collector-base junctions of the transistors, as is known in the art.

It should also be understood that the disclosed multiple access cell of the invention has significant advantages in comparison to prior art memory cells, such as the multiple access cell that is disclosed in the U.S. Pat. No. 4,127,899, to Dachtera, issued Nov. 28, 1978. More particularly, the preferred embodiment of FIG. 6 provides for two concurrent writes and two concurrent reads of a memory array, while requiring six transistors, and four bit/sense lines and providing only four base loads on the bases of the flip-flop of a cell. However, the cell of Dachtera utilizes an additional three transistors and an additional two column lines and provides a load of four collectors and two bases for each flip-flop latch of a cell, while only allowing two concurrent writes and one concurrent read.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

I claim:

1. A multiple access memory cell, comprising:

flip-flop store means for operating in one switching state to store a binary one and for operating in another switching state to store a binary zero;

at least one pair of accessing transistors, each transistor having means for operating in a conducting state to pass a sense current to read a switching state of said flip-flop store means and at least one of said accessing transistors having means for operating in a saturation state in response to a write signal to define a particular switching state for said flip-flop store means;

mode select means for applying a write select voltage to said flip-flop store means to allow the flip-flop store means to change switching states in response to the saturation state of one of said accessing transistors and for applying a read select voltage to said flip-flop store means to prevent the flip-flop store means from changing switching states; and current supply means responsive to a word signal for supplying said sense current.

2. The multiple access memory cell of claim 1 wherein said flip-flop store means includes two NPN flip-flop transistors conductively connected at their emitters for receiving said write select voltage and said lower read select voltage, the base of each flip-flop transistor being conductively connected to the collector of the other flip-flop transistor, the base of one flip-flop transistor conductively connected to the base of one accessing transistor of said at least one pair of accessing transistors and the base of the other flip-flop transistor connected to the base of the other accessing transistor of said at least one pair of accessing transistors.

3. The multiple access memory cell of claim 1 wherein the emitters of said at least one pair of accessing transistors are conductively connected for receiving said sense current and said current supply means includes conducting means for receiving said word signal and a resistor for applying the word signal to the connected emitters of said accessing transistors.

4. The multiple access memory cell of claim 1 wherein the emitters of said at least one pair of accessing transistors are conductively connected for receiving said sense current and said current supply means includes a source transistor having a base for receiving said word signal and an emitter connected to a supply potential through a source resistor, said source transistor conducting in response to said word signal to supply said sense current to the connected emitters of the accessing transistors.

5. The multiple access memory cell of claim 1 including at least one pair of diodes, one diode of the pair connected to a collector of one accessing transistor of said at least one pair of accessing transistors and the other diode of the pair connected to a collector of the other accessing transistor, each of said diodes passing sense current when the connected accessing transistor is in said conducting state and each of said diodes being back biased in response to a write signal.

6. The apparatus of claim 5 including means for integrating said diodes into the structure of said accessing transistors, a cathode region of the diodes being common with a collector region of the transistors and an anode region of the diodes being a diffusion, implant or Schottky barrier.

7. The multiple access memory cell of claim 1 including a plurality of said pairs of accessing transistors, the accessing transistors of each pair having conductively connected emitters for receiving a sense current in response to a particular word signal, the base of one accessing transistor of each pair conductively connected to the base of one flip-flop transistor and the base of the other accessing transistor of each pair conductively connected to the base of the other flip-flop transistor.

8. The multiple access memory cell of claim 7 including a plurality of diodes, each diode connected to a collector of one of said accessing transistors for back biasing in response to a write signal applied to saturate the connected accessing transistor and for passing sense current when the connected accessing transistor is conducting.

9. The multiple access memory cell of claim 7 wherein at least one of said pairs of accessing transistors includes means for operating only to read the switching state of said flip-flop store means.

10. The multiple access memory cell of claim 1, wherein said mode select means applies the write select voltage to said flip-flop store means to maintain the flip-flop store means in a low power quiescent state.

11. In a memory apparatus of a type wherein a plurality of common-accessed memory cells are accessed for reading and writing over at least one pair of shared-bit/sense lines, the improvement of multiple access apparatus for writing a binary one or zero into at least one cell while concurrently reading the stored binary contents of at least one other cell during a memory access cycle, the multiple access apparatus comprising:

a plurality of multiple access memory cells, each cell including, flip-flop store means for operating in one switching state to store a binary one and for operating in another switching state to store a binary zero;

at least one pair of accessing transistors each transistor having means for operating in a conducting state to pass a sense current to read a switching state of said flip-flop store means and for operating in a saturation state in response to a write signal to define a particular switching state for said flip-flop store means;

mode select means for applying a write select voltage to said flip-flop store means to allow the flip-flop store means to change switching states in response to the saturation state of one of said accessing transistors and for applying a read select voltage to said flip-flop store means to prevent the flip-flop store means from changing switching states; and current supply means connected to said at least one pair of accessing transistors for supplying said sense current to the at least one pair of accessing transistors in response to a particular word signal;

means for connecting one bit/sense line of a bit/sense line pair for receiving sense current from one accessing transistor of an accessing transistor pair of each cell and for passing a particular write signal to the one accessing transistor of each accessing transistor pair, and for connecting the other bit/sense line of a bit/sense line pair for receiving sense current from the other accessing transistor of an accessing transistor pair of each cell and for passing another particular write signal to the other accessing transistor of each accessing transistor pair;

word driver means for selectively applying a word signal to the current supply means of each pair of accessing transistors of the common-accessed memory cells; and mode driver means for selectively applying the read select voltage and the write select voltage to the mode select means of each of the common-accessed memory cells.

12. The multiple access apparatus of claim 11, including, write latch means for storing a binary bit;

writing means for applying a write signal on a bit/sense line to operate an accessing transistor of a common-accessed memory cell in the saturation state for storing a binary bit in the flip-flop store means of the cell, the bit stored in the cell corresponding to the bit stored in said write latch means, and sensing means for monitoring the sense current on each bit/sense line of a bit/sense line pair and for generating a logic signal for each bit/sense line, the logic signal for each line indicating the presence or absence of sense current on the line with respect to a zero reference current.

13. The apparatus of claim 12 wherein said sensing means includes means for compensating for a write signal on a bit/sense line to monitor the sense current on the line.

14. The apparatus of claim 12 wherein said sensing means includes means for exhibiting a low input impedance to said sense current.

15. The apparatus of claim 12 including logic means responsive to the bit stored in said write latch means and the logic signals generated for a particular bit/sense line pair by said sensing lach means, for generating a signal corresponding to the switching state of the flip-flop store means of a common-accessed memory cell being accessed by a read select voltage and a word signal defining the particular bit/sense line pair.

16. The multiple access apparatus of claim 11 including a plurality of pairs of accessing transistors and a plurality of bit/sense lines for accessing said common-accessed memory cells, each pair of bit/sense lines being connected to an associated pair of accessing transistors in each common-accessed memory cell and each pair of accessing transistors having a connected current supply means for supplying sense current in response to a particular word signal.

17. The apparatus of claim 11 wherein said means for connecting includes one diode connected between a collector of said one accessing transistor and said one bit/sense line and another diode connected between a collector of said other accessing transistor and said other bit/sense line.

18. The apparatus of claim 11 including at least one pair of read-only accessing transistors for each common-accessed memory cell and a read-only sense line connected to a particular transistor of each pair, each particular connected read-only accessing transistor of a cell operable in response to an applied read select voltage for the cell and word signal for the read-only accessing transistors of the cell to pass a sense current to the connected bit-sense line to register the switching state of the flip-flop store means of the cell.

19. The apparatus of claim 11 wherein said plurality of common accessed memory cells comprise a single column in a memory array, the array having a plurality of columns of memory cells, the mode select means of each cell in a row of cells being conductively connected to allow a mode selection for the entire row of cells and the current supply means for corresponding accessing transistor pairs of each cell in a row of cells conductively connected to receive a particular word signal to supply sense current to the corresponding accessing transistor pairs of each cell.

20. The apparatus of claim 11 wherein said mode driver means applies the write select voltage to the cells to maintain the cells in a low power quiescent state when no cell is being accessed and when at least one cell is being accessed said mode driver means applies the read select voltage to all cells not being written.

21. A multiple access memory array, comprising:
a plurality of memory cells, each cell for storing a binary bit, the cells arranged in rows corresponding to binary words and the rows of cells arranged in a columnar relation to form columns of cells, the cells in each column accessed for read and write operations by at least one pair of bit/sense lines;
a mode select line for each row of cells of the memory array, the mode select line of each row applying a mode select voltage to each cell of the row to define an accessing operation, one level of the mode select voltage defining a write operation for the cells of the row and another level of mode select voltage defining a read operation for the cells of a row; and
at least one word select line for each row of cells of the memory array, each cell of a row of cells having,
a memory flip-flop for storing a binary bit,
source means for passing a sense current in response to a word signal applied on said at least one word select line, and
accessing means for applying said sense current to access said memory flip-flop.

22. The multiple access memory array of claim 21 wherein each cell is accessed by a number n of pairs of bit/sense lines and each row of cells has n corresponding word select lines, each word select line of a row of cells applying a word signal to each cell of the row for accessing the memory flip-flop of the cell over a corresponding pair of bit/sense lines of the cell.

23. The multiple access memory array of claim 21 wherein said memory cells, mode select lines and word select lines are formed as a monolithic integrated circuit.

24. The multiple access memory array of claim 21 including means for defining an access cycle time for accessing cells of the array and means for operating the word select lines and the mode select lines of the array to execute a read operation for a cell and a write operation for a different cell concurrently during said access cycle time for each pair of bit/sense lines of the array.

* * * * *